United States Patent
Nagai et al.

(10) Patent No.: US 7,116,254 B1
(45) Date of Patent: Oct. 3, 2006

(54) COMPLEX TYPE SIGMA-DELTA ANALOG TO DIGITAL CONVERSION UNIT AND RECEIVER

(75) Inventors: Toshiaki Nagai, Kawasaki (JP); Hiroshi Yamazaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/235,338

(22) Filed: Sep. 27, 2005

(30) Foreign Application Priority Data

Apr. 26, 2005 (JP) ............................. 2005-128661

(51) Int. Cl.
*H03M 3/00* (2006.01)
(52) U.S. Cl. ...................................... 341/143; 341/155
(58) Field of Classification Search ......... 341/140–172
See application file for complete search history.

(56) References Cited

U.S. PATENT DOCUMENTS 5,764,171 A    6/1998   Stikvoort 6,674,381 B1 *  1/2004  Gomez et al. .............. 341/143
6,940,436 B1 *  9/2005  Hezar et al. ................ 341/143

FOREIGN PATENT DOCUMENTS

JP    2003-527795 A    9/2003
WO   WO 01/45338 A2   6/2001

* cited by examiner

*Primary Examiner*—Lam T. Mai
(74) *Attorney, Agent, or Firm*—Arent Fox PLLC

(57) ABSTRACT

There is provided a complex type sigma-delta analog to digital conversion unit that includes: a first subtractor; a first filter; a first analog to digital converter; a first digital to analog converter; a first sign controller; a second subtractor; a second filter; a second analog to digital converter; a second digital to analog converter; and a second sign controller, wherein the first sign controller inverts a positive/negative sign of an output signal of the first filter in response to a control signal and outputs it to the second filter, and the second sign controller inverts a positive/negative sign of an output signal of the second filter in response to the control signal and outputs it to the first filter.

18 Claims, 8 Drawing Sheets

F I G. 3A
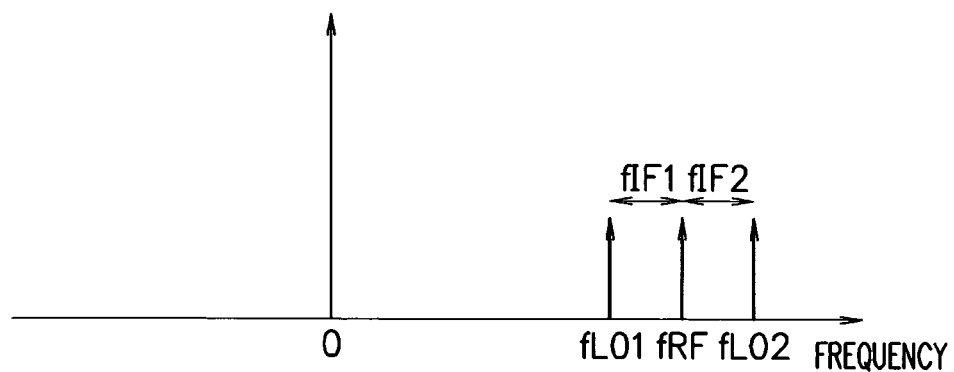
F I G. 3B
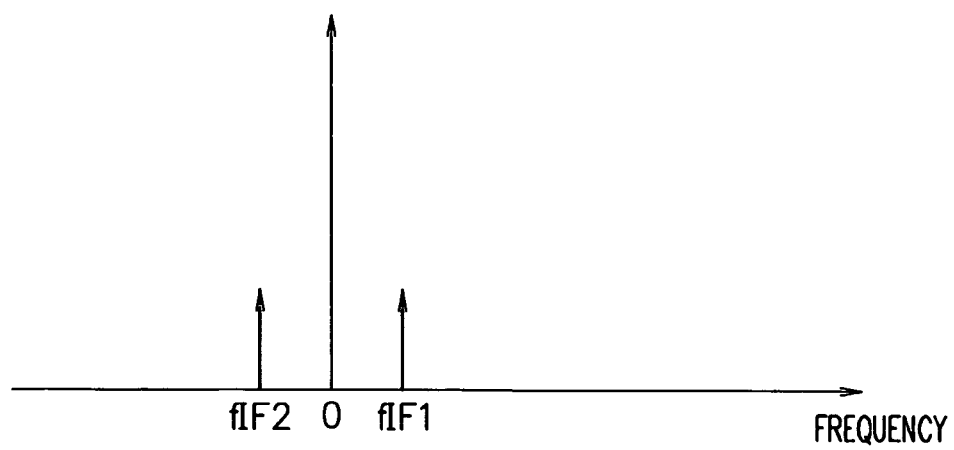

F I G. 4
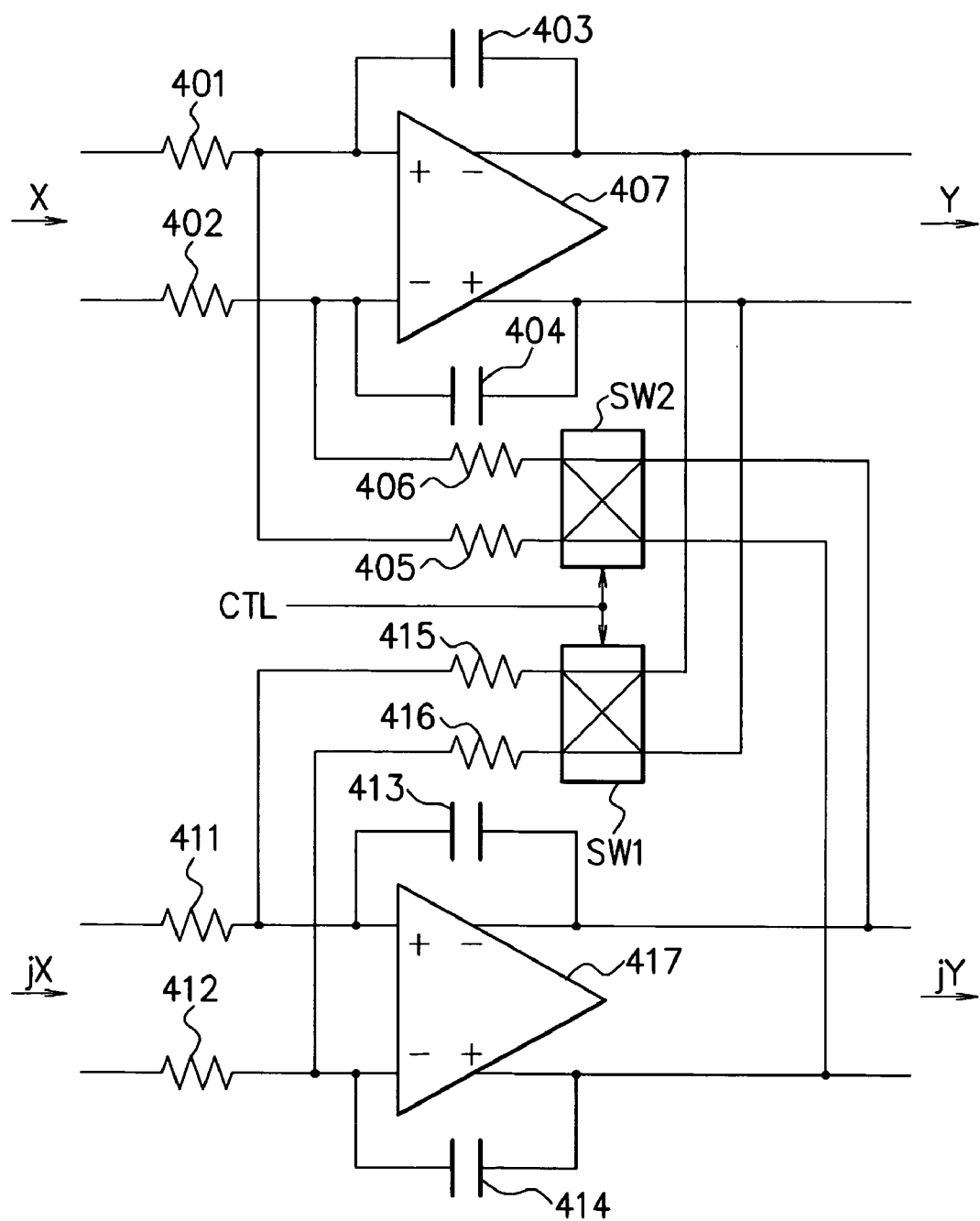

F I G. 9
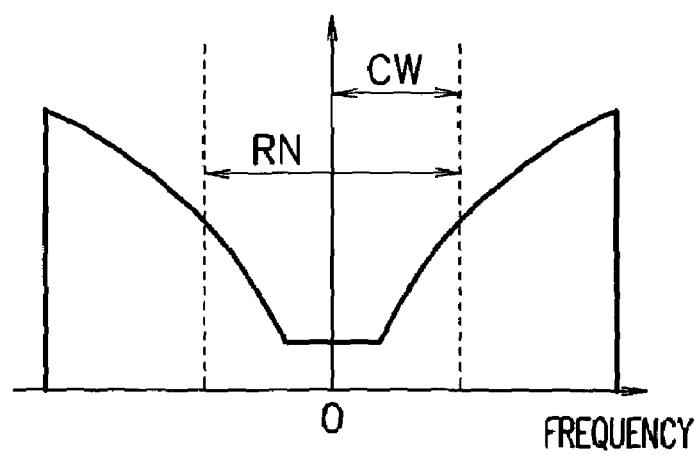
F I G. 10
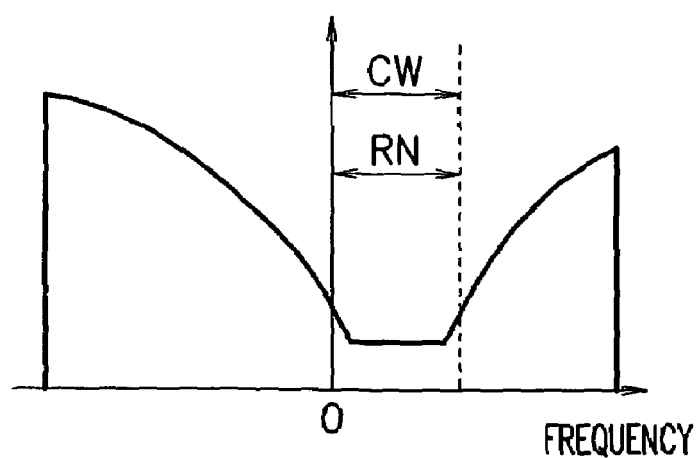

COMPLEX TYPE SIGMA-DELTA ANALOG TO DIGITAL CONVERSION UNIT AND RECEIVER

CROSS-REFERENCE TO RELATED APPLICATIONS

This application is based upon and claims the benefit of priority from the prior Japanese Patent Application No. 2005-128661, filed on Apr. 26, 2005, the entire contents of which are incorporated herein by reference.

BACKGROUND OF THE INVENTION

1. Field of the Invention

The present invention relates to a complex type sigma-delta analog to digital conversion unit and a receiver having the same.

2. Description of the Related Art

FIG. 7 is a view showing the configuration of a radio receiver having a real type sigma-delta analog to digital conversion unit described in the following Patent Document 1. A mixer 701a mixes an input signal with a 0° phase shift signal to generate an I signal. A mixer 701b mixes an input signal with a 90° phase shift signal to generate a Q signal. The I signal and Q signal are signals that are orthogonal to each other. A real type sigma-delta analog to digital conversion unit 700a, which includes a subtractor 711, a loop filter 712, an analog to digital (A/D) converter 713, and a digital to analog (D/A) converter 714, converts the I signal into a digital format from an analog format. A real type sigma-delta analog to digital conversion unit 700b, which includes a subtractor 711, a loop filter 712, an analog to digital (A/D) converter 713, and a digital to analog (D/A) converter 714 like the analog to digital conversion device 700a, converts the Q signal into a digital format from an analog format.

FIG. 8 is a view showing the configuration of a radio receiver having a complex type sigma-delta analog to digital conversion unit described in the following Patent Document 2. A mixer 801a mixes an input signal with a 0° phase shift signal to generate an I signal. A mixer 801b mixes an input signal with a 90° phase shift signal to generate a Q signal. The I signal and Q signal are signals that are orthogonal to each other. A complex type sigma-delta analog to digital conversion unit 800 includes subtractors 811a and 811b, loop filters 812a and 812b, analog to digital (A/D) converters 813a and 813b, and digital to analog (D/A) converters 814a and 814b. The output signal of the loop filter 812a is outputted to the loop filter 812b with its positive-negative sign maintained and, and the output signal of the loop filter 812b is outputted to the loop filter 812a with its positive-negative sign inverted.

[Patent Document 1] Translated National Publication of Patent Application No. 2003-527795

[Patent Document 2] U.S. Pat. No. 5,764,171

FIG. 9 is a view showing a quantization noise spectrum of the real type sigma-delta analog to digital conversion unit of FIG. 7. When an input signal is converted into a digital format from an analog format, a quantization noise due to the quantization will be generated. The quantization noise spectrum is symmetrical with respect to the axis of which the frequency is 0 Hz. The frequency range RN of the input signal includes positive and negative low-frequency ranges having a predetermined quantization noise or less. The positive frequency range of the input frequency range RN is a positive signal bandwidth CW.

FIG. 10 is a view showing a quantization noise spectrum of the complex type sigma-delta analog to digital conversion unit of FIG. 8. The difference between the real type and complex type sigma-delta analog to digital conversion units is whether the loop filter has a complex pole or not. In the real type of FIG. 9 the quantization noise spectrum becomes symmetrical with respect to the axis of the frequency is 0 Hz, while in the complex type of FIG. 10 the quantization noise spectrum shifted in the positive direction of the frequency axis can be obtained. In realizing a reduction in the quantization noise in the signal bandwidth CW with the same filter order, the same filter cut-off frequency, the same sampling frequency, and the nearly same power consumption, the complex type of FIG. 10 can reduce it much more as compared with the real type of FIG. 9.

However, in the real type of FIG. 9 the quantization noise level in the negative input frequency range is nearly equal as compared with the one in the positive input frequency range, while in the complex type of FIG. 10 the quantization noise level in the negative input frequency range becomes extremely large as compared with the one in the positive input frequency range and thus the input frequency range RN is restricted to a positive range.

SUMMARY OF THE INVENTION

The present invention is intended to provide a complex type sigma-delta analog to digital conversion unit capable of reducing the quantization noise and converting input signals having a positive and negative frequency into a digital format from an analog format, and to provide a receiver.

According to one aspect of the invention, there is provided a complex type sigma-delta analog to digital conversion unit that includes: a first subtractor for carrying out subtraction by inputting a first input signal and a first feedback signal; a first filter for filtering an output signal of the first subtractor; a first analog to digital converter for converting the output signal of the first filter into a digital format from an analog format; a first digital to analog converter which converts an output signal of the first analog to digital converter into an analog format from a digital format and outputs the converted signal to the first subtractor as the first feedback signal; a second subtractor for carrying out subtraction by inputting a second input signal and a second feedback signal, the second input signal being orthogonal to the first input signal; a second filter for filtering an output signal of the second subtractor; a second analog to digital converter for converting the output signal of the second filter into a digital format from an analog format; a second digital to analog converter which converts an output signal of the second analog to digital converter into an analog format from a digital format and outputs the converted signal to the second subtractor as the second feedback signal; a first sign controller which inverts a positive/negative sign of the output signal of the first filter in response to a control signal and outputs it to the second filter; and a second sign controller which inverts a positive/negative sign of the output signal of the second filter in response to the control signal and outputs it to the first filter.

BRIEF DESCRIPTION OF THE DRAWINGS

FIG. 3A and FIG. 3B are views for explaining a low IF (intermediate frequency) system according to this embodiment.

FIG. 4 is a circuit diagram showing a configuration example of a loop filter and a sign controller of FIG. 1 according to a second embodiment of the invention.

FIG. 9 is a view showing a quantization noise spectrum of the real type sigma-delta analog to digital conversion unit of FIG. 7.

FIG. 10 is a view showing a quantization noise spectrum of the complex type sigma-delta analog to digital conversion unit of FIG. 8.

DETAILED DESCRIPTION OF THE PREFERRED EMBODIMENTS

A First Embodiment

Figure 1:
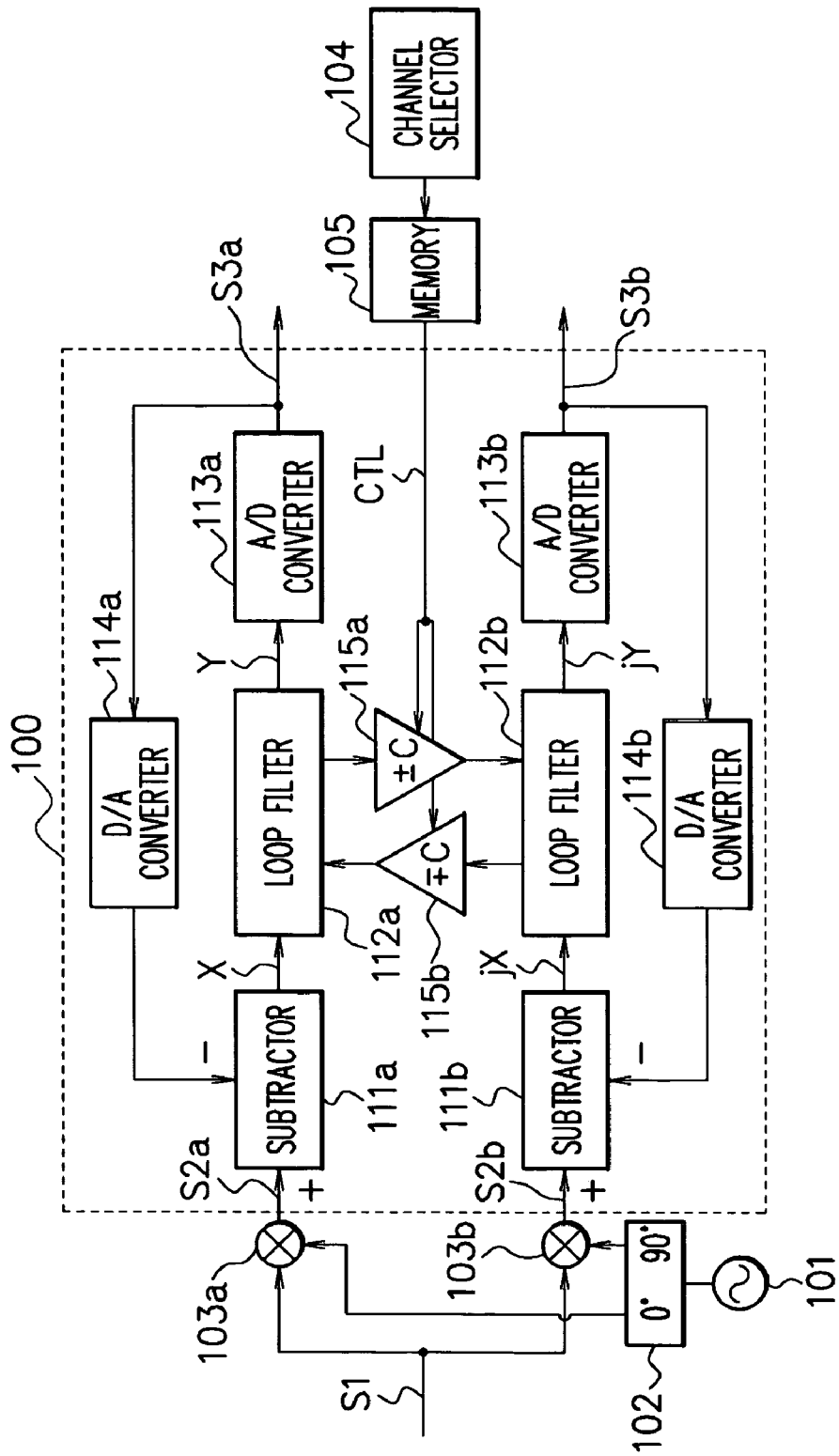
FIG. 1 is a view showing a configuration example of a radio receiver having a complex type sigma-delta analog to digital conversion unit according to a first embodiment of the invention.

FIG. 1 is a view showing a configuration example of a radio receiver including a complex type sigma-delta analog to digital conversion unit 100 according to a first embodiment of the invention. The radio receiver receives a radio signal via an antenna to generate an input signal S1. A local oscillator 101 generates a signal having a frequency fLO, based on which a phase shifter 102 generates a 0° phase shift signal and a 90° phase shift signal. A mixer 103a mixes the input signal S1 with the 0° phase shift signal to generate an I signal S2a. A mixer 103b mixes the input signal S1 with the 90° phase shift signal to generate a Q signal S2b. The I signal S2a and Q signal S2b are signals that are orthogonal to each other.

The complex type sigma-delta analog to digital conversion unit 100, which includes subtractors 111a and 111b, loop filters 112a and 112b, analog to digital (A/D) converters 113a and 113b, digital to analog (D/A) converters 114a and 114b and sign controller 115a, and 115b, converts the real signal S2a and the imaginary signal S2b of an analog format into a real signal S3a and an imaginary signal S3b of a digital format.

First, a real channel will be described. The subtractor 111a subtracts the feedback signal, which the digital to analog converter 114a outputs, from the I signal S2a and outputs a real signal X. The loop filter 112a inputs the real signal X and the output signal of the sign controller 115b, filters these input signals and outputs a real signal Y. The analog to digital converter 113a converts the real signal Y into a digital format from an analog format and outputs the real signal S3a of a digital format. The digital to analog converter 114a converts the real signal S3a into an analog format from a digital format and outputs it to the subtractor 111a as the feedback signal.

The digital to analog converter 114a outputs a signal obtained by converting the digital output signal S3a that is one cycle ahead into an analog format from. The subtractor 111a outputs a differential signal X between the last-time output signal and this-time input signal. The loop filter 112a, which is, for example, a low pass filter and has an integrator function, outputs this-time real signal Y by adding the differential signal X to the last-time real signal Y. The analog to digital converter 113a converts the signal Y into a digital format from an analog format. Thereby, the real signal S2a in an analog format can be converted into the real signal S3a in a digital format.

Next, an imaginary channel will be described. The subtractor 111b subtracts the feedback signal, which the digital to analog converter 114b outputs, from the Q signal S2b and outputs an imaginary signal jX. The loop filter 112b inputs the imaginary signal jX and the output signal of the sign controller 115a, filters these signals and outputs an imaginary signal jY. The analog to digital converter 113b converts the imaginary signal jY into a digital format from an analog format and outputs the imaginary signal S3b in a digital format. The digital to analog converter 114b converts the imaginary signal S3b into an analog format from a digital format and outputs it to the subtractor 111b as the feedback signal. The imaginary channel, like the real channel, can convert the imaginary signal S2b in an analog format into the imaginary signal S3b in a digital format.

A channel selector (the operation section) 104 selects, in response to a user's operation, the channel of the frequency to be reproduced and outputs a channel signal. A memory 105 stores the relationship between the channel signal and a control signal CTL, and outputs the control signal CTL in response to the channel signal. The sign controller 115a inverts the positive/negative sign of the output signal of the loop filter 112a in response to the control signal CTL and outputs it to the loop filter 112b. The sign controller 115b inverts the positive/negative sign of the output signal of the loop filter 112b in response to the control signal CTL and outputs it to the loop filter 112a. Moreover, the sign controllers 115a and 115b amplify the output signal of the loop filters 112a and 112b by a factor of a constant "C", respectively, and output them to the loop filter 112b and 112a.

Figure 2:
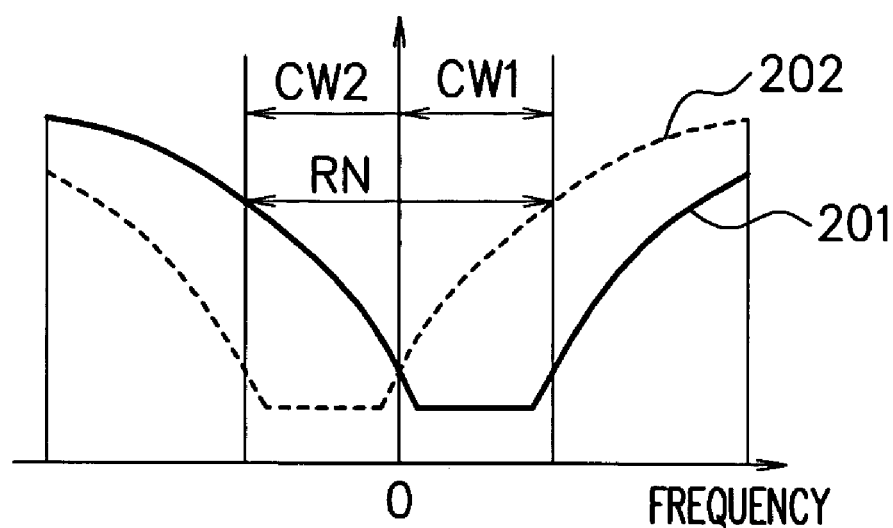
FIG. 2 is a view showing a quantization noise spectrum of the complex type sigma-delta analog to digital conversion unit of FIG. 1.

FIG. 2 is a view showing a quantization noise spectrum of the complex type sigma-delta analog to digital conversion unit of FIG. 1. When the input signal is converted into a digital format from an analog format, the quantization noise will be generated due to this quantization. The horizontal axis represents the frequency and the vertical axis represents the quantization noise.

When the control signal CTL is in a first state, the sign controller 115a maintains the positive/negative sign of the output signal of the loop filter 112a and outputs it to the loop filter 112b, and the sign controller 115b inverts the positive/negative sign of the output signal of the loop filter 112b and outputs it to the loop filter 112a. In this case, in the real type of FIG. 9 the quantization noise spectrum becomes symmetrical with respect to the axis of which the frequency is 0 Hz, while in the complex type of FIG. 2 a quantization noise spectrum 201 shifted in the positive direction of the frequency axis can be obtained. In case of realizing a reduction in the quantization noise in the signal bandwidth CW1 with the same filter order, the same filter cut-off frequency, the same sampling frequency, and the nearly same power consumption, the complex type of FIG. 2 can reduce it more much as compared with the real type of FIG. 9.

When the control signal CTL is in a second state, the sign control 115a inverts the positive/negative sign of the output signal of the loop filter 112a and outputs it to the loop filter 112b, and the sign controller 115b maintains the positive/negative sign of the output signal of the loop filter 112b and outputs it to the loop filter 112a. In this case, in the real type of FIG. 9 the quantization noise spectrum becomes symmetrical with respect to the axis of which the frequency is 0 Hz, while in the complex type of FIG. 2 a quantization noise spectrum 202 shifted in the negative direction of the frequency axis can be obtained. In case of realizing a reduction in the quantization noise in the signal bandwidth CW2 with the same filter order, the same filter cut-off frequency, the same sampling frequency, and the nearly same power consumption, the complex type of FIG. 2 can reduce it much more as compared with the real type of FIG. 9.

As described above, according to this embodiment, the sign controllers 115a and 115b selectively invert the positive/negative sign of the coefficient (the constant) C, thereby making it possible to obtain the quantization noise spectrum 201 shifted in the positive direction of the frequency and the quantization noise spectrum 202 shifted in the negative direction of the frequency. The quantization noise spectrums 201 and 202 become mutually symmetric with respect to the axis of which the frequency is 0 Hz. Thereby, the quantization noise can be reduced not only in the signal bandwidth CW1 in the case where the frequency is positive, but also in the signal bandwidth CW2 in the case where the frequency is negative. Moreover, the input frequency range RN can be expanded not only to the positive but also to the negative frequency range.

FIG. 3A and FIG. 3B are views for explaining a low IF (an intermediate frequency) system according to this embodiment. The low IF system is a system in which the received signal S1 is once converted into a signal having a relatively low intermediate frequency fIF, and thereafter only a required bandwidth is selected and filtered. Accordingly, only the signal having a required bandwidth can be selected efficiently. This frequency conversion is carried out, by mixing the output from the local oscillator 101 having the frequency fLO such that the intermediate frequency fIF becomes a difference with the frequency fRF.

The case where the signal S1 of the frequency fRF is selected using fLO1 as the frequency of the signal of the local oscillator 101 will be described. Since the frequency fRF is larger than the frequency fLO1, the intermediate frequency fIF1 becomes a positive low frequency from the relationship of the intermediate frequency fIF1=fRF−fLO1. In this case, a quantization noise spectrum 501 of FIG. 2 is selected to use the positive signal bandwidth (the channel width) CW1.

In addition, the case where the signal S1 of the frequency fRF is selected using fLO2 as the frequency of the signal of the local oscillator 101 will be described. Since the frequency fRF is smaller than the frequency fLO2, the intermediate frequency fIF2 becomes a negative low frequency from the relationship of the intermediate frequency fIF2=fRF−fLO2. In this case, a quantization noise spectrum 502 of FIG. 2 is selected to use the negative signal bandwidth (the channel width) CW2.

Figure 8:
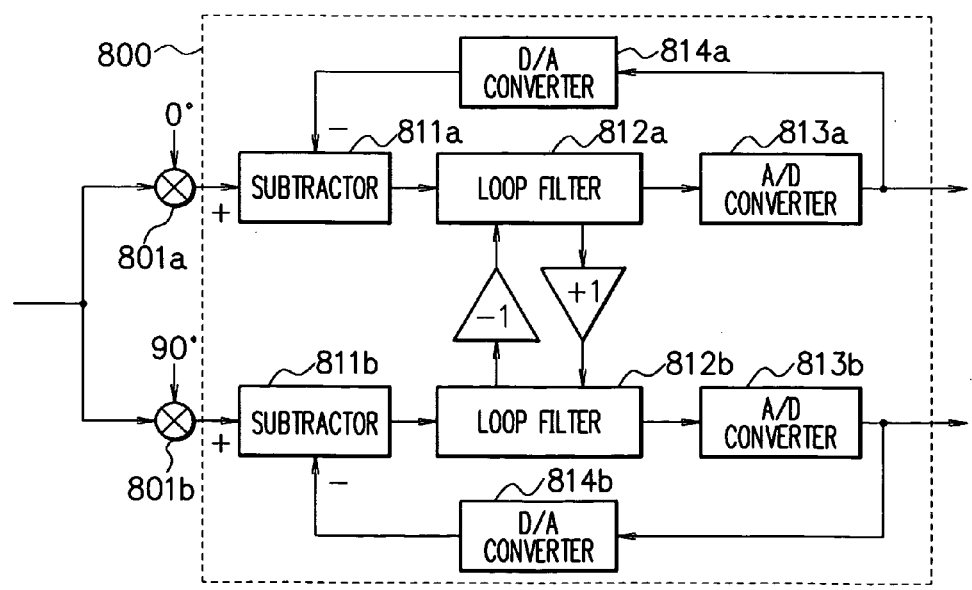
FIG. 8 is a view showing the configuration of a radio receiver having a complex type sigma-delta analog to digital conversion unit of Patent Document 2.

Although in the radio receiver of FIG. 8 only the positive frequency can be used as the intermediate frequency, in this embodiment both positive and negative frequencies can be used as the intermediate frequency. For this reason, in this embodiment the magnitude relationship between the oscillation frequency fLO of the local oscillator 101 and the input frequency fRF is not restricted and thus the circuit size and the power consumption can be reduced. Specifically, the circuit of the local oscillator 101 can be simplified as compared with the one of FIG. 8.

A Second Embodiment

FIG. 4 is a circuit diagram showing a configuration example of the loop filters 112a and 112b and the sign controllers 115a and 115b of FIG. 1 according to a second embodiment of the invention. The loop filters 112a and 112b are continuous-time filters of an RC (a resistor-capacitor) active filter, respectively. The sign controllers 115a and 115b correspond to switches SW1 and SW2, respectively. The input real signal X, the input imaginary signal jX, the output real signal Y, and the output imaginary signal jY are differential signals, respectively. Each differential signal is a signal with two signals whose phases are inverted to each other combined as one pair.

The real differential signal X is inputted to the positive input terminal and the negative input terminal of a differential amplifier 407 via resistors 401 and 402. A capacitor 403 is coupled between the positive input terminal and the negative output terminal of the differential amplifier 407. A capacitor 404 is coupled between the negative input terminal and the positive output terminal of the differential amplifier 407. The real differential signal Y is outputted from the positive output terminal and the negative output terminal of the differential amplifier 407.

The imaginary differential signal jX is inputted to the positive input terminal and the negative input terminal of a differential amplifier 417 via resistors 411 and 412. A capacitor 413 is coupled between the positive input terminal and the negative output terminal of the differential amplifier 417. A capacitor 414 is coupled between the negative input terminal and the positive output terminal of the differential amplifier 417. The imaginary differential signal jY is outputted from the positive output terminal and the negative output terminal of the differential amplifier 417.

The switches SW1 and SW2 make the output differential signal lines of the loop filters 112a and 112b straight or cross in response to the control signal CTL, respectively, and couple them with the input differential signal lines of the loop filters 112b and 112a.

First, the case where the control signal CTL is in the first state and the quantization noise spectrum 201 of FIG. 2 is selected will be described. The switch SW1 (the sign controller 115a) cross-couples the output differential signal line of the differential amplifier 407 with the input differential signal line of the differential amplifier 417 via resistors 415 and 416. Namely, the positive output terminal of the differential amplifier 407 is coupled with the positive input terminal of the differential amplifier 417, and the negative output terminal of the differential amplifier 407 is coupled with the negative input terminal of the differential amplifier 417. Accordingly, the real differential signal Y is inputted to the differential amplifier 417 with its positive-negative sign maintained. Moreover, the switch SW2 (the sign controller 115b) cross-couples the output differential signal line of the differential amplifier 417 with the input differential signal line of the differential amplifier 407 via resistors 405 and 406. Namely, the positive output terminal of the differential amplifier 417 is coupled with the negative input terminal of the differential amplifier 407, and the negative output terminal of the differential amplifier 417 is coupled with the positive input terminal of the differential amplifier 407. Accordingly, the imaginary differential signal jY is inputted to the differential amplifier 407 with its positive-negative sign inverted.

Next, the case where the control signal CTL is in the second state and the quantization noise spectrum 202 of FIG. 2 is selected will be described. The switch SW1 (the sign controller 115a) couples the output differential signal line of the differential amplifier 407 straight through the input differential signal line of the differential amplifier 417 via the resistors 415 and 416. Namely, the positive output terminal of the differential amplifier 407 is coupled with the negative input terminal of the differential amplifier 417, and the negative output terminal of the differential amplifier 407 is coupled with the positive input terminal of the differential amplifier 417. Accordingly, the real differential signal Y is inputted to the differential amplifier 417 with its sign inverted. Moreover, the switch SW2 (the sign controller 115b) couples the output differential signal line of the differential amplifier 417 straight through the input differential signal line of the differential amplifier 407 via the resistors 405 and 406. Namely, the positive output terminal of the differential amplifier 417 is coupled with the positive input terminal of the differential amplifier 407, and the negative output terminal of the differential amplifier 417 is coupled with the negative input terminal of the differential amplifier 407. Accordingly, the imaginary differential signal jY is inputted to the differential amplifier 407 with its positive-negative sign maintained.

A Third Embodiment

Figure 5:
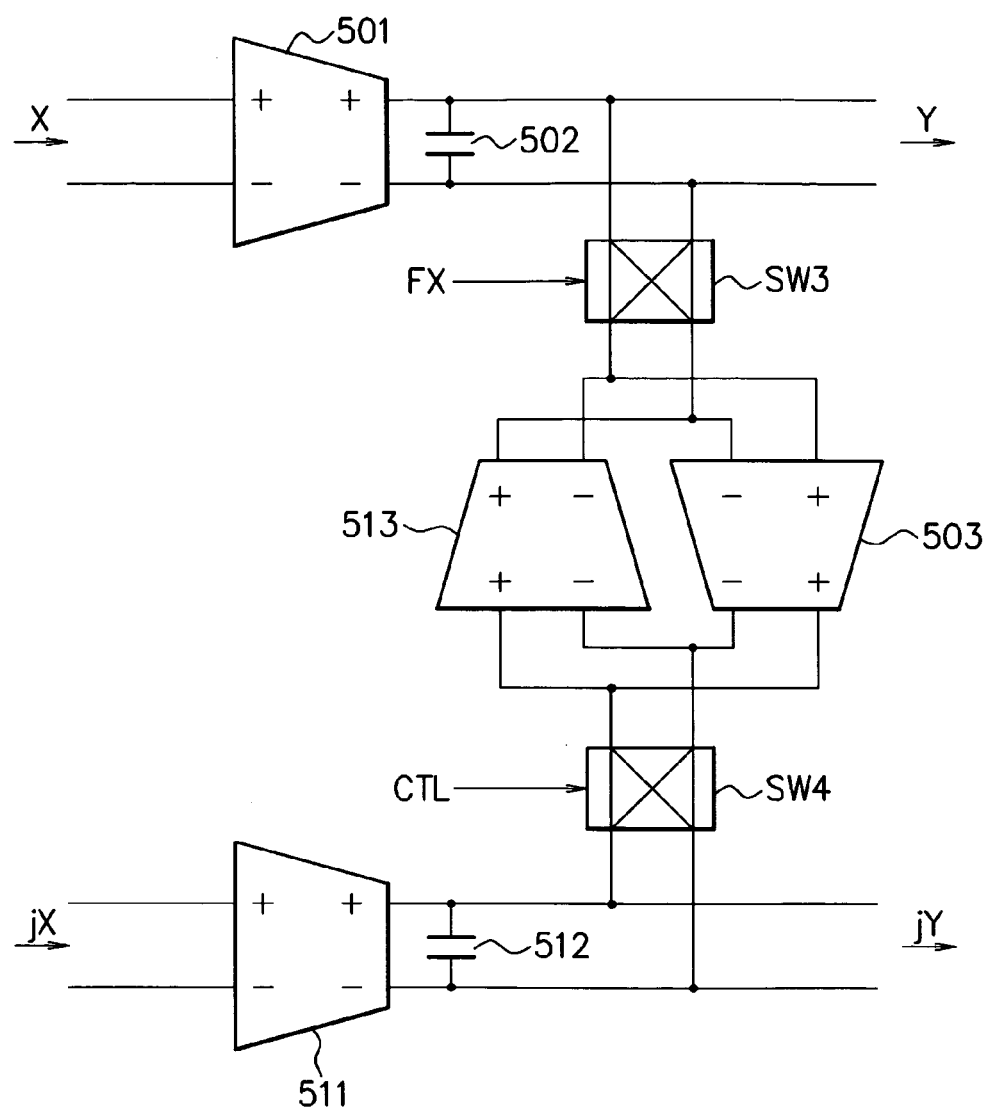
FIG. 5 is a circuit diagram showing a configuration example of the loop filter and the sign controller of FIG. 1 according to a third embodiment of the invention.

FIG. 5 is a circuit diagram showing a configuration example of the loop filters 112a and 112b and the sign controllers 115a and 115b of FIG. 1 according to a third embodiment of the invention. The loop filters 112a and 112b are continuous-time filters of a gm-C (transconductor-capacitor) filter, respectively. The sign controllers 115a and 115b correspond to a switch SW4. The input real signal X, the input imaginary signal jX, the output real signal Y, and the output imaginary signal jY are differential signals, respectively.

The real differential signal X is inputted to the positive input terminal and the negative input terminal of an OTA (Operational Trans conductor Amplifier) 501. The OTA 501, which is a voltage-current conversion amplifier, converts the differential voltage signal X into a differential current signal and outputs it. A capacitor 502 is coupled between the positive output terminal and the negative output terminal of the OTA 501. The real differential voltage signal Y is a signal between both ends of the capacitor 502.

The imaginary differential signal jX is inputted to the positive input terminal and the negative input terminal of an OTA 511. The OTA 511, which is a voltage-current conversion amplifier, converts the differential voltage signal jx to a differential current signal and outputs it. A capacitor 512 is coupled between the positive output terminal and the negative output terminal of the OTA 511. The imaginary differential voltage signal jY is a signal between both ends of the capacitor 512.

A switch SW3 couples the output differential signal line of the OTA 501 straight through, or cross-couples it with OTAs 503 and 513 in a fixed manner in response to a fixing signal FX. The switch SW4 selectively couples the output differential signal line of the OTA 511 straight through, or cross-couples it with the OTAs 503 and 513 in response to the control signal CTL.

(1) Straight Coupling of Switch SW3

The case where the switch SW3 is fixed in a manner of the straight coupling will be described. The positive input terminal of the OTA 503 is coupled with the positive output terminal of the OTA 501 and the negative input terminal of the OTA 503 is coupled with the negative output terminal of the OTA 501. The positive output terminal of the OTA 513 is coupled with the negative output terminal of the OTA 501 and the negative output terminal of the OTA 513 is coupled with the positive output terminal of the OTA 501.

In this case, the case where the control signal CTL is in the first state and the quantization noise spectrum 201 of FIG. 2 is selected will be described. The switch SW4 (the sign controllers 115a and 115b) makes a straight coupling. Namely, the positive output terminal of the OTA 503 is coupled with the positive output terminal of the OTA 511 and the negative output terminal of the OTA 503 is coupled with the negative output terminal of the OTA 511. The positive input terminal of the OTA 513 is coupled with the positive output terminal of OTA the 511 and the negative input terminal of OTA the 513 is coupled with the negative output terminal of the OTA 511. As a result, via the OTA 503, the real differential signal Y is outputted to the output differential signal line of the OTA 511 with its positive-negative sign maintained. Namely, this means that the sign controller 115a maintains the positive-negative sign. Moreover, via the OTA 513, the imaginary differential signal jY is outputted to the output differential signal line of the OTA 501 with its positive-negative sign inverted. Namely, this means that the sign controller 115b inverts the positive-negative sign.

Next, the case where the control signal CTL is in the second state and the quantization noise spectrum 202 of FIG. 2 is selected will be described. The switch SW4 (the sign controllers 115a and 115b) makes a cross coupling. Namely, the positive output terminal of the OTA 503 is coupled with the negative output terminal of the OTA 511 and the negative output terminal of the OTA 503 is coupled with the positive output terminal of the OTA 511. The positive input terminal of the OTA 513 is coupled with the negative output terminal of OTA the 511 and the negative input terminal of the OTA 513 is coupled with the positive output terminal of the OTA 511. As a result, via the OTA 503, the real differential signal Y is outputted to the output differential signal line of the OTA 511 with its positive-negative sign inverted. Namely, this means that the sign controller 115a inverts the positive-negative sign. Moreover, via the OTA 513, the imaginary differential signal jY is outputted to the output differential signal line of the OTA 501 with its sign positive-negative maintained. Namely, this means that the sign controller 115b maintains the positive-negative sign.

(2) Cross Coupling of Switch SW3

The case where the switch SW3 is fixed in a manner of the cross coupling will be described. The positive input terminal of the OTA 503 is coupled with the negative output terminal of the OTA 501 and the negative input terminal of the OTA 503 is coupled with the positive output terminal of the OTA 501. The positive output terminal of the OTA 513 is coupled with the positive output terminal of the OTA 501 and the negative output terminal of the OTA 513 is coupled with the negative output terminal of the OTA 501.

In this case, the case where the control signal CTL is in the first state and the quantization noise spectrum 201 of FIG. 2 is selected will be described. The switch SW4 (the sign controllers 115a and 115b) makes a cross coupling. Namely, the positive output terminal of the OTA 503 is coupled with the negative output terminal of the OTA 511 and the negative output terminal of the OTA 503 is coupled with the positive output terminal of the OTA 511. The positive input terminal of the OTA 513 is coupled with the negative output terminal of the OTA 511 and the negative input terminal of the OTA 513 is coupled with the positive output terminal of the OTA 511. As a result, via the OTA 503, the real differential signal Y is outputted to the output differential signal line of the OTA 511 with its positive-negative sign inverted. Namely, this means that the sign controller 115a inverts the positive-negative sign. Moreover, via the OTA 513, the imaginary differential signal jY is outputted to the output differential signal line of OTA 501 with its positive-negative sign maintained. Namely, this means that the sign controller 115b maintains the positive-negative sign.

As described above, the switches SW3 and SW4 are switches for making a straight/cross coupling. Although the inversion operation of the positive-negative sign is possible only with one of the switches, it is also necessary to insert the dummy switch SW3, which is not used, in order to maintain symmetry between the real channel and the imaginary channel. In this embodiment, an example of using the switch SW3 as the dummy is shown. The dummy switch SW3 is fixed on a manner of a straight or cross coupling.

In case of the gm-C filter, both the input differential signal terminal of the OTA 503 and the output differential signal terminal of the OTA 513 can be coupled with the output differential signal terminal of the OTA 501, and both the output differential signal terminal of the OTA 503 and the input differential signal terminal of the OTA 513 can be coupled with the output differential signal terminal of the OTA 511, whereby it is possible to simplify a wiring as compared with the case of the RC active filter of FIG. 4, and to use the sign controllers 115a and 115b in common, thereby to realize it with one switch SW4.

A Fourth Embodiment

Figure 6:
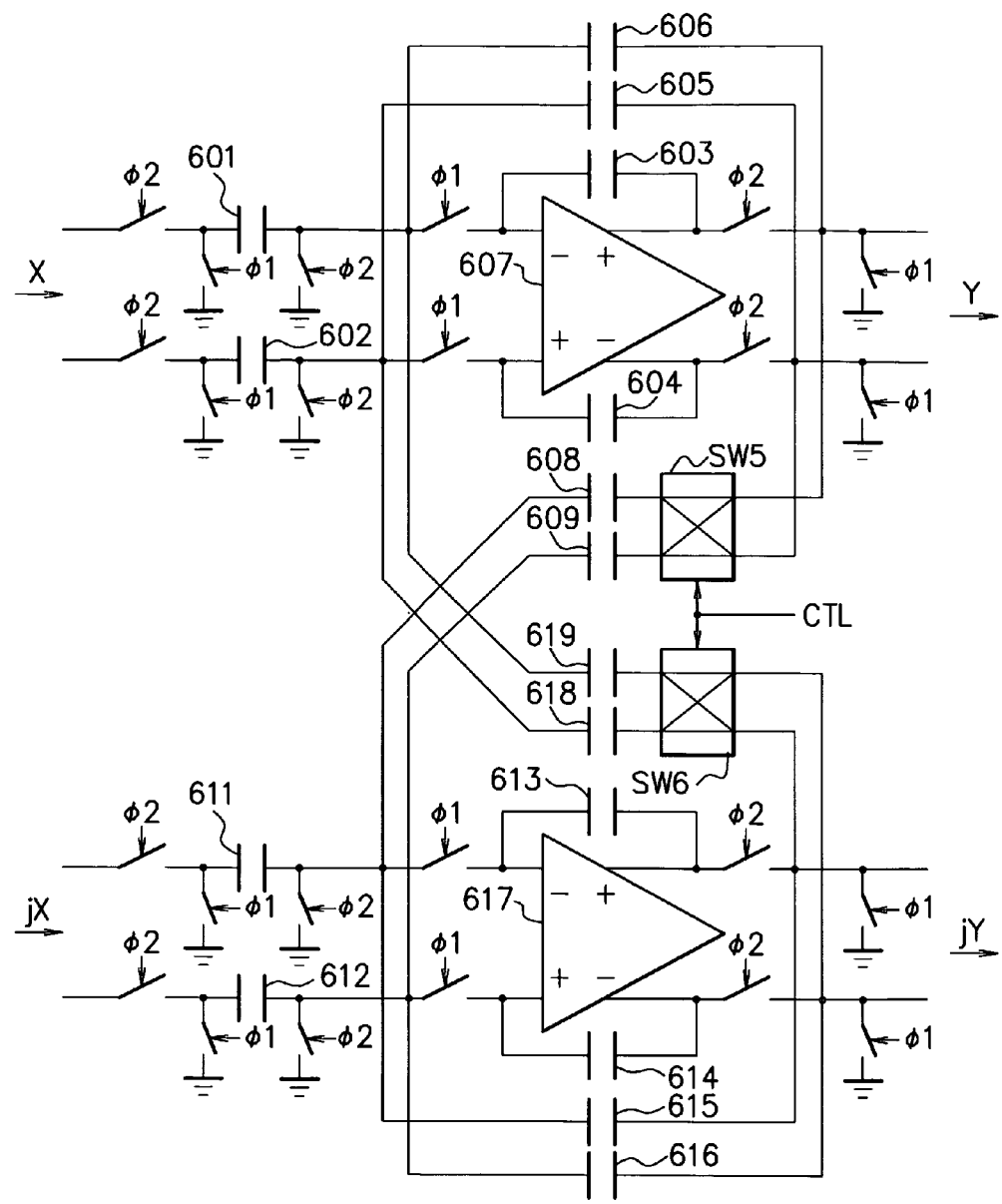
FIG. 6 is a circuit diagram showing a configuration example of the loop filter and the sign controller of FIG. 1 according to a fourth embodiment of the invention.

FIG. 6 is a circuit diagram showing a configuration example of the loop filters 112a and 112b and the sign controllers 115a and 115b of FIG. 1 according to a fourth embodiment of the invention. The loop filters 112a and 112b are discrete-time filters of a switched capacitor filter, respectively. The sign controllers 115a and 115b correspond to switches SW5 and SW6, respectively. The input real signal X, the input imaginary signal jx, the output real signal Y, and the output imaginary signal jY are differential signals, respectively.

Capacitors 603–606 are coupled with a differential amplifier 607 and capacitors 613–616 are coupled with a differential amplifier 617. A switch for a control signal $\phi$1 will be turned on when the control signal $\phi$1 comes into, for example, a high level. A switch for a control signal $\phi$2 will be turned on when the control signal $\phi$2 comes into, for example, a high level. The control signals $\phi$1 and $\phi$2 are pulse signals whose phases are inverted to each other. The switches for the control signals $\phi$1 and $\phi$2 are turned on alternately.

First, when the switch for the control signal $\phi$2 is turned on, the real differential signal X with the ground assumed to be a reference will be stored in capacitors 601 and 602, and the imaginary differential signal jX with the ground assumed to be a reference will be stored in capacitors 611 and 612. Next, when the switch for the control signal $\phi$1 is turned on, the real differential signal X stored in the capacitors 601 and 602 will be inputted to the positive and negative input terminals of the differential amplifier 607, and the imaginary differential signal jX stored in the capacitors 611 and 612 will be inputted to the positive and negative input terminals of the differential amplifier 617. Next, when the switch for the control signal $\phi$2 is turned on, the signal of the positive and negative output terminals of the differential amplifier 607 will be outputted as the real differential signal Y and stored in capacitors 608 and 609, and the signal of the positive and negative output terminals of the differential amplifier 617 is outputted as the imaginary differential signal jy and is stored in capacitors 618 and 619.

Next, the case where the control signal CTL is in the first state and the quantization noise spectrum 201 of FIG. 2 is selected will be described. A switch SW5 (the sign controller 115a) cross-couples the output differential signal line of the differential amplifier 607 with the input differential signal line of the differential amplifier 617. Namely, the positive output terminal of the differential amplifier 607 is coupled with the positive input terminal of the differential amplifier 617 and the negative output terminal of the differential amplifier 607 is coupled with the negative input terminal of the differential amplifier 617. Accordingly, the real differential signal Y is inputted to the differential amplifier 617 with its positive-negative sign maintained. Moreover, a switch SW6 (the sign controller 115b) cross-couples the output differential signal line of the differential amplifier 617 with the input differential signal line of the differential amplifier 607. Namely, the positive output terminal of the differential amplifier 617 is coupled with the negative input terminal of the differential amplifier 607, and the negative output terminal of the differential amplifier 617 is coupled with the positive input terminal of the differential amplifier 607. Accordingly, the imaginary differential signal jY is inputted to the differential amplifier 607 with its positive-negative sign inverted.

Next, the case where the control signal CTL is in the second state and the quantization noise spectrum 202 of FIG. 2 is selected will be described. The switch SW5 (the sign controller 115a) couples the output differential signal line of the differential amplifier 607 straight through the input differential signal line of the differential amplifier 617. Namely, the positive output terminal of the differential amplifier 607 is coupled with the negative input terminal of the differential amplifier 617 and the negative output terminal of the differential amplifier 607 is coupled with the positive input terminal of the differential amplifier 617. Accordingly, the real differential signal Y is inputted to the differential amplifier 617 with its positive-negative sign inverted. Moreover, the switch SW6 (the sign controller 115b) couples the output differential signal line of the differential amplifier 617 straight through the input differential signal line of the differential amplifier 607. Namely, the positive output terminal of the differential amplifier 617 is coupled with the positive input terminal of the differential amplifier 607 and the negative output terminal of the differential amplifier 617 is coupled with the negative input terminal of the differential amplifier 607. Accordingly, the imaginary differential signal jY is inputted to the differential amplifier 607 with its positive-negative sign maintained.

As described above, in the first through fourth embodiments, the positive-negative sign of the coefficient (the constant) C configuring the complex filters 112a and 112b can be switched depending on whether the intermediate frequency fIF is positive or negative. In the low IF system, basically, there is no possibility that the signal of the positive intermediate frequency and the signal of the negative intermediate frequency are received simultaneously. Accordingly, the positive-negative sign of a pass band (the frequency range in which the quantization noise is suppressed) of the signal can be inverted by switching the sign of the coefficient C in conjunction with the positive-negative sign of the intermediate frequency fIF.

Figure 7:
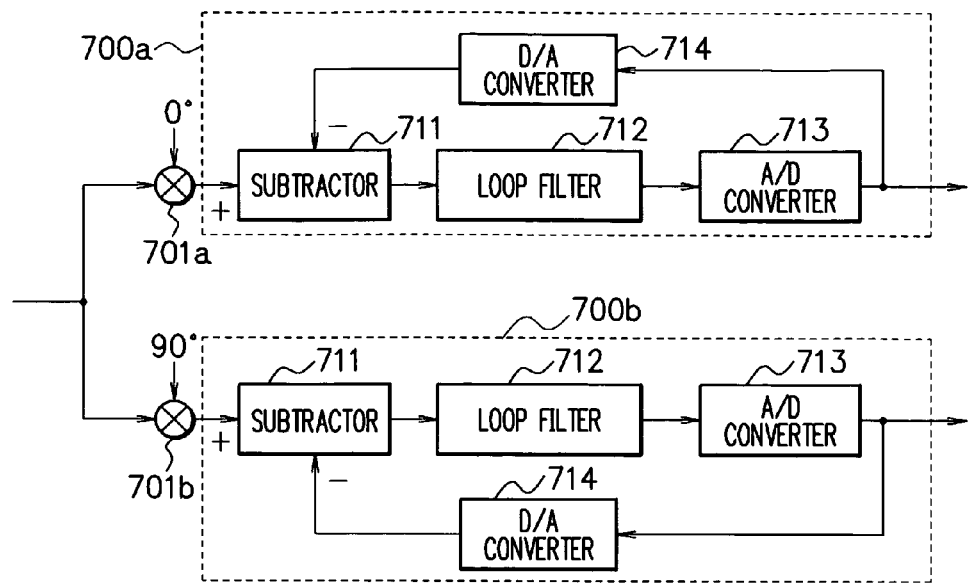
FIG. 7 is a view showing the configuration of a radio receiver having a real type sigma-delta analog to digital conversion unit of Patent Document 1.

The receiver of FIG. 7 and FIG. 9 has a drawback that a SN ratio is low, and the receiver of FIG. 8 and FIG. 10 has a drawback that both positive and negative intermediate frequency fIF cannot be used. According to the above-described embodiments, the intermediate frequency fIF of both positive/negative can be used, while making the most of the merit that the SN ratio of the complex type can be enhanced. Accordingly, in the receiver of the embodiments described above the circuit can be simplified as compared with the case where the complex type sigma-delta analog to digital conversion unit of FIG. 8 is used because the requirements for the oscillation frequency fLO of the local oscillator 101 of the receiver is eased. Moreover, as shown in the above-described embodiments, only a small-sized switch circuit requires an increase in the circuit size.

In addition, in any one of the embodiments described above, just examples of the embodiments in implementing the invention have been shown, and thus the technical scope of the invention should not be limitedly interpreted. Namely, the invention can be implemented in various forms without departing from the technical thoughts or the main features thereof.

Since the first and second sign controllers couple the first and second filters to each other, thereby allowing the complex type sigma-delta analog to digital conversion unit to be realized, the quantization noise can be reduced as compared with the real type. Moreover, since the first and second sign controllers invert the positive/negative sign in response to the control signal, the input signal of the positive and negative frequencies can be converted into a digital format from an analog format.

What is claimed is:

1. A complex type sigma-delta analog to digital conversion unit, comprising:
   a first subtractor for carrying out subtraction by inputting a first input signal and a first feedback signal;
   a first filter for filtering an output signal of the first subtractor;
   a first analog to digital converter for converting an output signal of the first filter into a digital format from an analog format;
   a first digital to analog converter which converts an output signal of the first analog to digital converter into an analog format from a digital format and outputs the converted signal to the first subtractor as the first feedback signal;
   a second subtractor for carrying out subtraction by inputting a second input signal and a second feedback signal, the second input signal being orthogonal to the first input signal;
   a second filter for filtering an output signal of the second subtractor;
   a second analog to digital converter for converting an output signal of the second filter into a digital format from an analog format;
   a second digital to analog converter which converts an output signal of the second analog to digital converter into an analog format from a digital format and outputs the converted signal to the second subtractor as the second feedback signal;
   a first sign controller which inverts a positive/negative sign of the output signal of the first filter in response to a control signal and outputs it to the second filter; and
   a second sign controller which inverts a positive/negative sign of the output signal of the second filter in response to the control signal and outputs it to the first filter.

2. The complex type sigma-delta analog to digital conversion unit according to claim 1, wherein:
   when the control signal is in a first state, the first sign controller maintains the positive/negative sign of the output signal of the first filter and outputs it to the second filter, and the second sign controller inverts the positive/negative sign of the output signal of the second filter and outputs it to the first filter; and
   when the control signal is in a second state, the first sign controller inverts the positive/negative sign of the output signal of the first filter and outputs it to the second filter, and the second sign controller maintains the positive/negative sign of the output signal of the second filter and outputs it to the first filter.

3. The complex type sigma-delta analog to digital conversion unit according to claim 1, wherein the first and second filters are RC active filters, respectively.

4. The complex type sigma-delta analog to digital conversion unit according to claim 1, wherein the first and second filters are gm-C filters, respectively.

5. The complex type sigma-delta analog to digital conversion unit according to claim 1, wherein the first and second filters are switched capacitor filters, respectively.

6. The complex type sigma-delta analog to digital conversion unit according to claim 1, wherein the first and second sign controllers amplify the output signals of the first and second filters by a factor of a constant, respectively.

7. The complex type sigma-delta analog to digital conversion unit according to claim 1, wherein in the first and second filters, the input signal and the output signal are differential signals, respectively.

8. The complex type sigma-delta analog to digital conversion unit according to claim 7, wherein the first and second sign controllers make the lines of the output differential signals of the first and second filters straight or cross in response to the control signal and couple them with the second and first filters, respectively.

9. The complex type sigma-delta analog to digital conversion unit according to claim 1, further comprising an operation section for outputting the control signal in response to an operation.

10. A receiver comprising:
    the complex type sigma-delta analog to digital conversion unit according to claim 1; and
    a mixer for mixing an input signal, thereby to generate first and second input signals that are orthogonal to each other.

11. The receiver according to claim 10, wherein:
    when the control signal is in a first state, the first sign controller maintains the positive/negative sign of the output signal of the first filter and outputs it to the second filter, and the second sign controller inverts the positive/negative sign of the output signal of the second filter and outputs it to the first filter; and
    when the control signal is in a second state, the first sign controller inverts the positive/negative sign of the output signal of the first filter and outputs it to the second filter, and the second sign controller maintains the positive/negative sign of the output of the second filter and outputs it to the first filter.

12. The receiver according to claim 10, wherein the first and second filters are RC active filters, respectively.

13. The receiver according to claim 10, wherein the first and second filters are gm-C filters, respectively.

14. The receiver according to claim 10, wherein the first and second filters are switched capacitor filters, respectively.

15. The receiver according to claim 10, wherein the first and second sign controllers amplify the first and second filters by a factor of a constant, respectively.

16. The receiver according to claim 10, wherein in the first and second filters, the input signal and the output signal are differential signals, respectively.

17. The receiver according to claim 16, wherein the first and second sign controllers make the lines of the output differential signals of the first and second filters straight or cross in response to the control signal and couple them with the second and first filters, respectively.

18. The receiver according to claim 10, further comprising an operation section for outputting the control signal in response to an operation.

* * * * *